US010650296B2

(12) United States Patent
Martinjak et al.

(10) Patent No.: US 10,650,296 B2
(45) Date of Patent: May 12, 2020

(54) MOBILE CARD READER FOR LIGHTNING PROTECTION SYSTEMS

(71) Applicant: ERICO INTERNATIONAL CORPORATION, Solon, OH (US)

(72) Inventors: Greg Martinjak, Solon, OH (US); Bradford McIntyre, Bedford, OH (US)

(73) Assignee: ERICO INTERNATIONAL CORPORATION, Solon, OH (US)

( * ) Notice: Subject to any disclaimer, the term of this patent is extended or adjusted under 35 U.S.C. 154(b) by 0 days.

(21) Appl. No.: 16/272,862

(22) Filed: Feb. 11, 2019

(65) Prior Publication Data

US 2019/0251409 A1 Aug. 15, 2019

Related U.S. Application Data

(60) Provisional application No. 62/630,083, filed on Feb. 13, 2018.

(51) Int. Cl.
*G06K 19/06* (2006.01)
*G06K 7/08* (2006.01)
*G06K 7/00* (2006.01)
*G01R 29/08* (2006.01)

(52) U.S. Cl.
CPC ... *G06K 19/06196* (2013.01); *G01R 29/0842* (2013.01); *G06K 7/0008* (2013.01); *G06K 7/082* (2013.01)

(58) Field of Classification Search
CPC .......... G06K 19/06196; G06K 7/0008; G06K 7/082; G01R 29/0842
See application file for complete search history.

(56) References Cited

U.S. PATENT DOCUMENTS

| | | | |
|---|---|---|---|
| 3,889,185 | A | 6/1975 | Wojtasinski et al. |
| 7,508,186 | B2 | 3/2009 | Mortensen |
| 7,806,657 | B2 | 10/2010 | Schram et al. |
| 7,810,729 | B2 | 10/2010 | Morley, Jr. |
| 7,896,248 | B2 | 3/2011 | Morley, Jr. |
| 7,918,394 | B1 | 4/2011 | Morley, Jr. |
| 8,006,552 | B2 | 8/2011 | Matsushita |
| 8,239,150 | B2 | 8/2012 | Baumheinrich et al. |
| 8,427,333 | B2 | 4/2013 | Kraemer |
| 8,584,946 | B2 | 11/2013 | Morley, Jr. |
| 8,730,638 | B2 | 5/2014 | Higashi et al. |

(Continued)

FOREIGN PATENT DOCUMENTS

| | | |
|---|---|---|
| CN | 2706767 Y | 6/2005 |
| CN | 201589808 U | 9/2010 |

(Continued)

OTHER PUBLICATIONS

MAGTEK; Magnetic Strip Card Standards spec sheet; Copyright 2011 MagTek, Inc.; 2 pages.

(Continued)

*Primary Examiner* — Seung H Lee
(74) *Attorney, Agent, or Firm* — Quarles & Brady LLP (57) ABSTRACT

A mobile card reader can be configured to connect to an input module of a mobile device. The mobile card reader can scan a magnetic stripe card from a structure exposed to lightning strikes in order to output a lightning-indicator signal to the input module. The lightning-indicator signal can be analyzed to determine a magnitude of a lightning strike to which the magnetic stripe card and the structure have been exposed.

20 Claims, 8 Drawing Sheets

(56) References Cited

U.S. PATENT DOCUMENTS

| | | |
|---|---|---|
| 9,141,835 B1 | 9/2015 | Weber et al. |
| 9,218,514 B2 | 12/2015 | Kim et al. |
| 9,450,392 B2 | 9/2016 | Erichsen |
| 9,747,474 B2 | 8/2017 | Morley, Jr. |
| 2010/0328084 A1 | 12/2010 | Kraemer |
| 2011/0267027 A1 | 11/2011 | Iannotti et al. |
| 2012/0029853 A1 | 2/2012 | Baumheinrich et al. |
| 2013/0130743 A1 | 5/2013 | Lin |
| 2014/0131442 A1 | 5/2014 | Morrow et al. |
| 2014/0203082 A1 | 7/2014 | Huh |
| 2017/0351883 A1 | 12/2017 | Morley, Jr. |

FOREIGN PATENT DOCUMENTS

| | | |
|---|---|---|
| CN | 103543313 A | 1/2014 |
| CN | 206906470 U | 1/2018 |
| DE | 4401070 C1 | 4/1995 |
| DE | 4425163 A1 | 1/1996 |
| DK | 338289 A | 1/1990 |
| EP | 0663598 A2 | 7/1995 |

OTHER PUBLICATIONS

Jay Kadis; Magnetic Recording: Analog Tape; downloaded from https://ccma.stanford.edu/courses/192a/Lecture7-Magnetic_recording.pdf, Jan. 18, 2018; Copyright 2014 Jay Kadis (for educational use only); 11 pages.

Horii; Measurement of Lightning Current by the Magnetizing Effect on magnetic Tape; 7th International Symposium on High Voltage Engineering; Aug. 26-30, 1991; 4 pages.

MOBILE CARD READER FOR LIGHTNING PROTECTION SYSTEMS

CROSS-REFERENCE TO RELATED APPLICATIONS

This application claims priority to U.S. Provisional Patent Application No. 62/630,083, titled "Mobile Card Reader for Lightning Protection Systems" and filed on Feb. 13, 2018, the entirety of which is incorporated herein by reference.

BACKGROUND

Wind turbines and other structures can be subject to lightning strikes, which have the potential to damage electronic and other components of the structures. For reasons relating to maintenance, insurance, and other considerations, it may be useful to understand the severity of a lightning strike or strikes that have occurred for a particular structure. Assessing strike severity can be complicated, however, due the unpredictability of lightning strikes, the remoteness or general inaccessibility of relevant systems, and other factors.

SUMMARY

Some embodiments of the disclosure provide a mobile reader system for lightning protection systems that include a magnetic stripe card, with the magnetic stripe card being configured to retain data on a data-storage stripe and to have a portion of the data erased in response to one or more lightning strikes on a structure. A reader body can support a magnetic reader assembly with an output module, the magnetic reader assembly being configured to read the data-storage stripe to output a lightning-indicator signal to the output module. One or more computer-implemented modules can be configured to receive the lightning-indicator signal via an input module in communication with the output module, and to identify, based on analysis of the lightning-indicator signal, an indicator of a maximum current passing through a portion of the structure from the one or more lightning strikes.

Some embodiments of the disclosure provide a lightning protection system for a structure that is exposed to one or more lightning strikes. A magnetic stripe card can be configured to retain data on a data-storage stripe and to have a portion of the data erased in response to the one or more lightning strikes. A mobile reader body can support a magnetic reader assembly that includes an output module, the magnetic reader assembly being configured to read the data-storage stripe to output a lightning-indicator signal via the output module. One or more computer-implemented modules can be configured to receive the lightning-indicator signal via an input module of a handheld computing device that is in communication with the output module, and to identify, based on analysis of the lightning-indicator signal, an indicator of a maximum current passing through the structure from the one or more lightning strikes.

Some embodiments of the disclosure provide a method of monitoring a structure that is exposed to one or more lightning strikes. A magnetic stripe card can be retrieved from the structure, with the magnetic stripe card being configured to retain data on a data-storage stripe and having had a portion of the data erased in response to the one or more lightning strikes on the structure. The data-storage stripe can be scanned with a mobile reader system to provide a lightning-indicator signal at an output module of the mobile reader system. The lightning-indicator signal can be received, via the output module, at an input module of a mobile computing device. Based on computer-implemented analysis of the received lightning-indicator signal, an indicator can be identified of a maximum current passing through a portion of the structure from the one or more lightning strikes.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

In some embodiments, aspects of the invention, including computerized implementations of methods according to the invention, can be implemented as a system, method, apparatus, or article of manufacture using standard programming or engineering techniques to produce software, firmware, hardware, or any combination thereof to control a computer or other processor device to implement aspects detailed herein. Accordingly, for example, embodiments of the invention can be implemented as a set of instructions, tangibly embodied on a non-transitory computer-readable media, such that a processor device can implement the instructions based upon reading the instructions from the computer-readable media.

The term "article of manufacture" as used herein is intended to encompass a computer program accessible from any computer-readable device, carrier (e.g., non-transitory signals), or media (e.g., non-transitory media). For example, computer-readable media can include but are not limited to magnetic storage devices (e.g., hard disk, floppy disk, magnetic strips, and so on), optical disks (e.g., compact disk (CD), digital versatile disk (DVD), and so on), smart cards, and flash memory devices (e.g., card, stick, and so on). Additionally it should be appreciated that a carrier wave can be employed to carry computer-readable electronic data such as those used in transmitting and receiving electronic mail or in accessing a network such as the Internet or a local area network (LAN). Those skilled in the art will recognize many modifications may be made to these configurations without departing from the scope or spirit of the claimed subject matter.

Some embodiments of the invention can be implemented as systems and/or methods, including computer-implemented methods. Some embodiments of the invention can include (or utilize) a device such as an automation device, a special purpose or general purpose computer including various computer hardware, software, firmware, and so on, consistent with the discussion below.

Certain operations of methods according to the invention, or of systems executing those methods, may be represented schematically in the FIGS. Unless otherwise specified or limited, representation in the FIGS. of particular operations in particular spatial order is not intended to require those operations to be executed in a particular order. Certain operations represented in the FIGS., or otherwise disclosed herein, can be executed in different orders, as appropriate for particular embodiments of the invention. Further, in some embodiments, certain operations can be executed in parallel, including by dedicated parallel processing devices, or separate computing devices configured to interoperate as part of a large system.

As used herein in the context of computer implementation, unless otherwise specified or limited, the terms "component," "system," "module," and the like are intended to refer to a computer-related system that includes hardware, software, a combination of hardware and software, or software in execution. For example, a component may be, but is not limited to being, a processor device, a process running on a processor device, an object, an executable, a thread of execution, a program, and/or a computer. By way of illustration, both an application running on a computer and the computer can be a component. One or more components (or system, module, and so on) may reside within a process and/or thread of execution, may be localized on one computer, distributed between two or more computers or other processor devices, and/or included within another component (or system, module, and so on).

The discussion herein is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As noted above, it may be useful to record or otherwise monitor lightning strikes on certain installations, such as wind turbines. In some conventional arrangements, a magnetic stripe card ("MSC") and an associated stationary reader can be used for this purpose.

Figure 1:
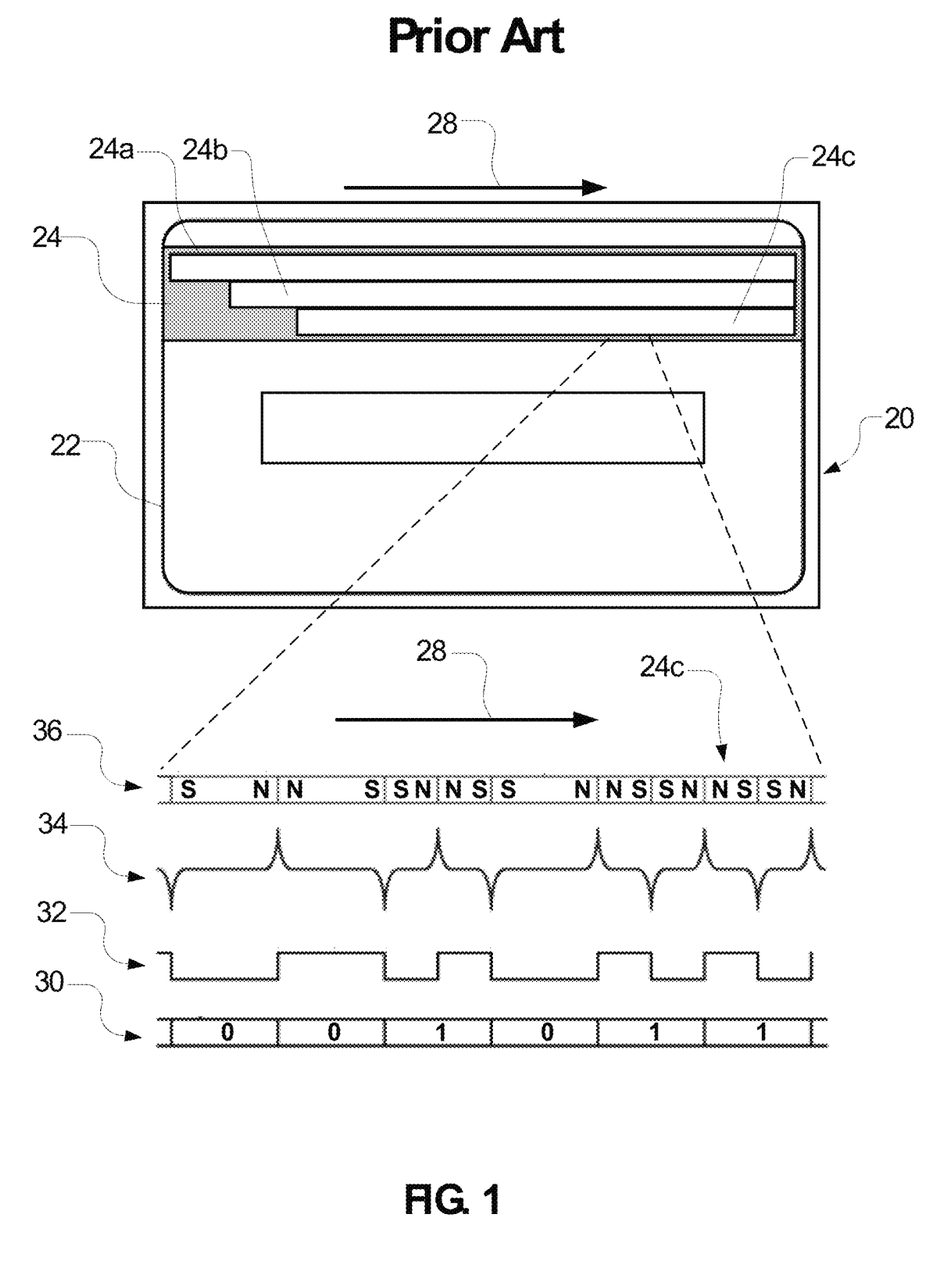
FIG. 1 is a schematic view of a conventional magnetic stripe card and certain data-storage principles thereof.

As illustrated in FIG. 1, a conventional MSC 20 can exhibit a characteristic rectangular shape, with a plastic body 22 and a data-storage stripe 24. In conventional arrangements, as illustrated in FIG. 1, the data-storage stripe 24 is divided into three tracks 24a, 24b, 24c that are formed to include iron oxide. By magnetizing the iron oxide into an array 26 of magnetic poles, data of various types can be stored on the MSC 20. For example, as illustrated in the enlarged view of the track 24c and corresponding schematic in FIG. 1, binary data 30 can be converted to a binary waveform 32, which can be expressed by a card-writing device (not shown in FIG. 1) as a temporally varying pattern of magnetic flux 34. By moving the MSC 20 across the card-writing device in a swipe direction (e.g., as illustrated by arrow 28), the magnetic flux 34 can be encoded in the pole arrangement of the array 26 (e.g. in the illustrated arrangement of "N" and "S" poles on the track 24c). Generally, the data encoded in the array 26 can then be read using a reversed process.

In conventional arrangements for financial data storage (e.g., for credit cards), each of the three tracks on the data-storage stripe 24 are encoded using different respective bit densities and encoding schemes. However, for other applications, other types of encoding and bit densities can be used, as can other numbers or arrangements of tracks.

It has been recognized that MSCs can be used to record the magnitude of lightning strikes on structures, such as wind turbines. But conventional approaches to reading the recorded magnitudes from such MSCs can tend to be cumbersome. For example, conventional readers for recorded lightning strikes may be configured to desktop use rather than being usefully portable (e.g., easily transported by hand, in a small pocket or other enclosure, and so on). Further, in some cases, conventional readers can require dedicated power sources or can provide displays and other user interfaces that have relatively minimal utility. For example, some conventional readers may use liquid-crystal display technology and be equipped to display merely the recorded maximum voltage of a lightning strike, without being able to make available other information or to receive customizing user input. Embodiments of the invention can address these and other issues.

Figures 2, 3:
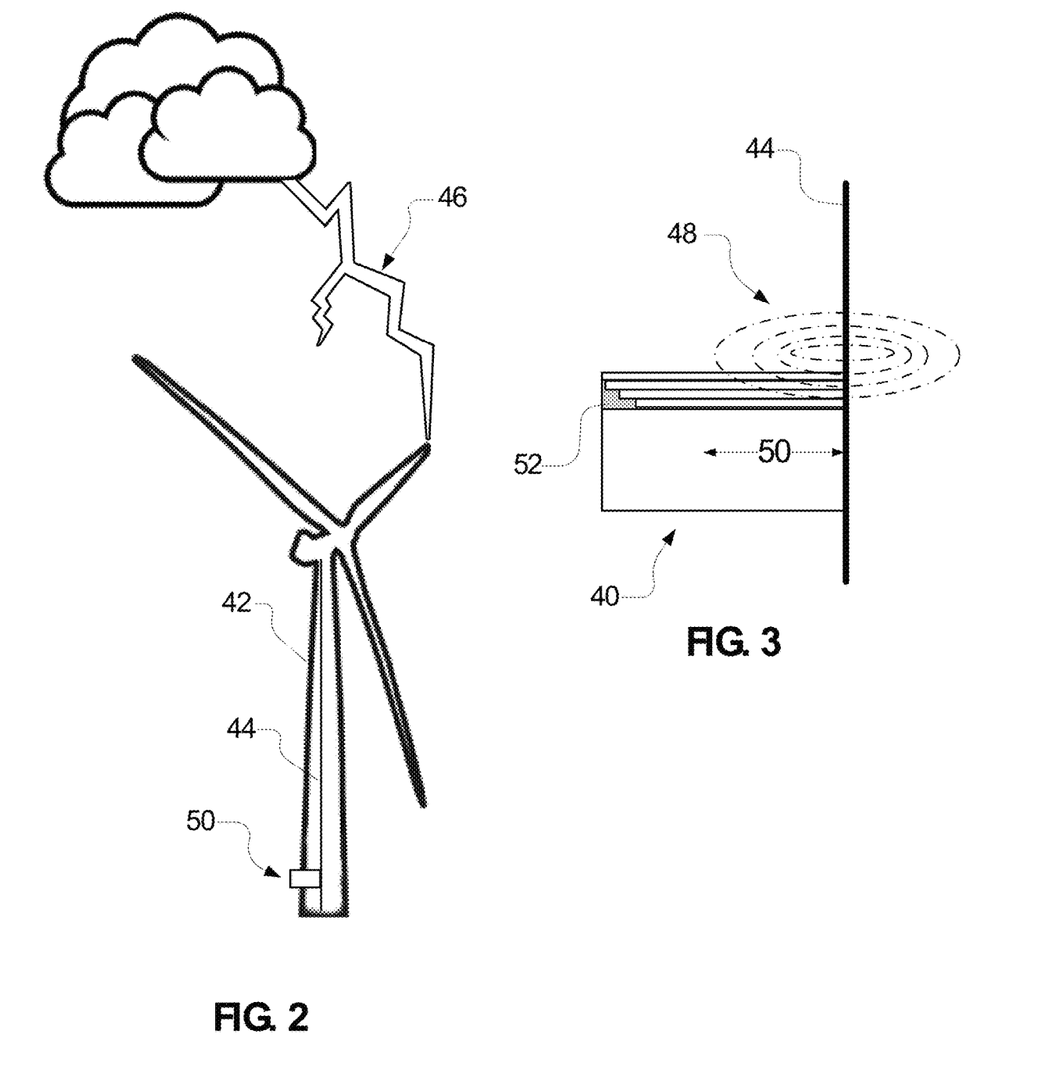
FIGS. 2 through 4 are schematic views of aspects of an installation of a magnetic stripe card with a lightning protection system for a wind turbine, according to an embodiment of the invention.

FIGS. 2 and 3 illustrate the use of a customized MSC 40, according to an embodiment of the invention, in order to record data regarding lightning strikes on a wind turbine 42. In the illustrated example installation, the MSC 40 is mounted proximate and perpendicular to a conductor 44 of the wind turbine 42. The conductor 44 is electrically connected to points on the wind turbine 42 that act as receptors for lightning strikes, such as tip receptors or other strike points (not shown) of a lightning protection system. Accordingly, when lightning 46 strikes the wind turbine 42, current generated by the strike flows through the conductor 44, generating a magnetic field 48 (see FIG. 3) in the vicinity of the MSC 40.

Due to electro-magnetic interactions, when the magnetic field 48 is sufficiently strong, it will tend to erase any magnetically encoded data on the MSC 40. Moreover, the strength of the magnetic field 48 at a given distance from the conductor 44 can be reliably correlated to the magnitude of the current flow through the conductor 44 and, thereby, to the severity (i.e., strength) of the relevant lightning strike. Accordingly, with the MSC 40 oriented generally perpendicularly to the conductor 44, an approximate magnitude of a lightning strike on the wind turbine 42 can be determined based on identifying a length 50 of a data-storage stripe 52 of the MSC 40 (or of a track thereof) along which data has been erased. Further, because the erasure of data from the data-storage stripe 52 is cumulative for any given installation, the total erased length on a card (e.g., the length 50) can be used to approximate the magnitude of the most severe lightning strike of a series of strikes after the initial installation of the MSC 40 (i.e., the lightning strike that causes the largest current to flow through the conductor 44).

In some embodiments, rather than using the conventional bit density and encoding schemes illustrated in FIG. 1, the data-storage stripe 52 of the MSC 40 can be written with a customized data scheme. Customized data schemes can be useful, for example, in order to optimize performance for recording lightning strike severity or to improve card security by increasing the difficulty of copying a particular card. As one example, as illustrated in particular in FIG. 4, the MSC 40 is configured with at least one data track on the data-storage stripe 52 having been encoded with a regularly repeating magnetic array that includes the maximum number of alternating magnetic poles that can be maintained on the MSC 40. This may be useful, for example, in order to maximize the accuracy with which the magnitude of a lightning strike can be determined. In other embodiments, other approaches are possible.

Figure 4:
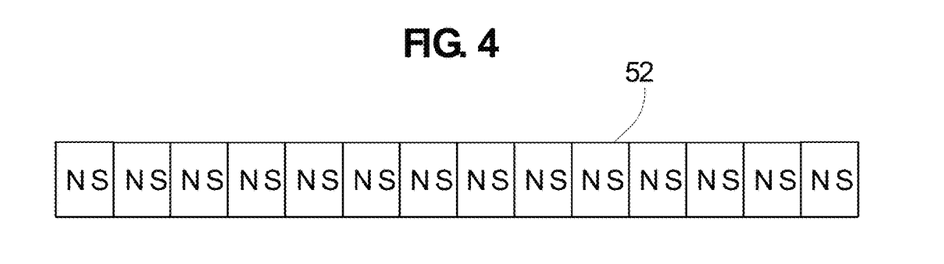

In some embodiments, MSCs can be designed to exhibit relatively high resilience to erasure from exposure to magnetic fields. For example, whereas conventional arrangements may employ 2750 oersted cards, the MSC 40 can be configured as a 4000 oersted card. This arrangement can allow the MSC 40 to record a greater range of lightning strike intensities than a conventional MSC.

As also discussed above, conventional systems for reading MSCs to assess lightning strikes can be unwieldy, expensive, and relatively non-portable. Further, some conventional systems can rely on proprietary output devices in order to provide relevant data to system users. This can significantly reduce the ability of users to readily evaluate lightning activity for wind turbines, particularly in widely dispersed, numerous, remote locations at which wind turbines are often installed.

In contrast, embodiments of the invention can include relatively small, highly portable readers with output modules that are configured to interface input modules of a variety of mobile devices, including consumer smartphones and tablets. Accordingly, by using a reader and a mobile-device module (e.g., mobile app or other software) according to embodiments of the invention, a user can easily check an MSC for evidence of a lightning strike from any number of locations. Further, due to relatively low cost, high portability, and significant interoperability with different mobile devices, some embodiments can allow for users to easily implement widespread monitoring of a very large number of highly dispersed installations.

In different embodiments, different output modules can be used, including cellular, Wi-Fi, or other radio-enabled modules, wired modules such as standard audio plugs, and so on. In some embodiments, output modules can include configurable hardware or software modules, such as devices configured as universal asynchronous receiver-transmitters ("UARTs"). Similarly, different input modules can be used, including cellular, Wi-Fi, or other radio-enabled modules, wired modules such as standard audio input ports, configurable hardware or software modules, and so on.

In some examples presented below, wired audio plugs and input ports are discussed in particular. Unless otherwise specified, discussion of audio plugs and input ports below can be applied to other types of input and output modules capable of analog or digital communication, including UART modules and others.

Figure 5:
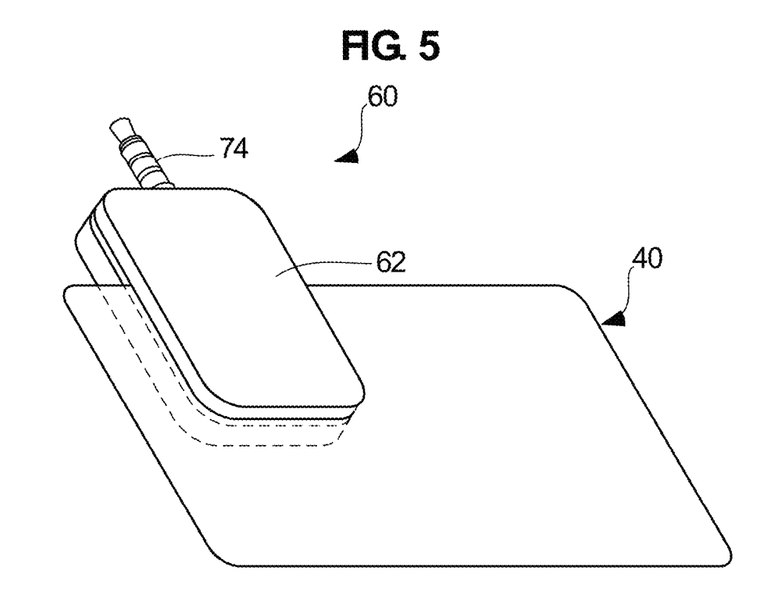
FIG. 5 is an isometric view of the magnetic stripe card of FIGS. 2 through 4 with a card reader according to an embodiment of the invention.
Figure 6:
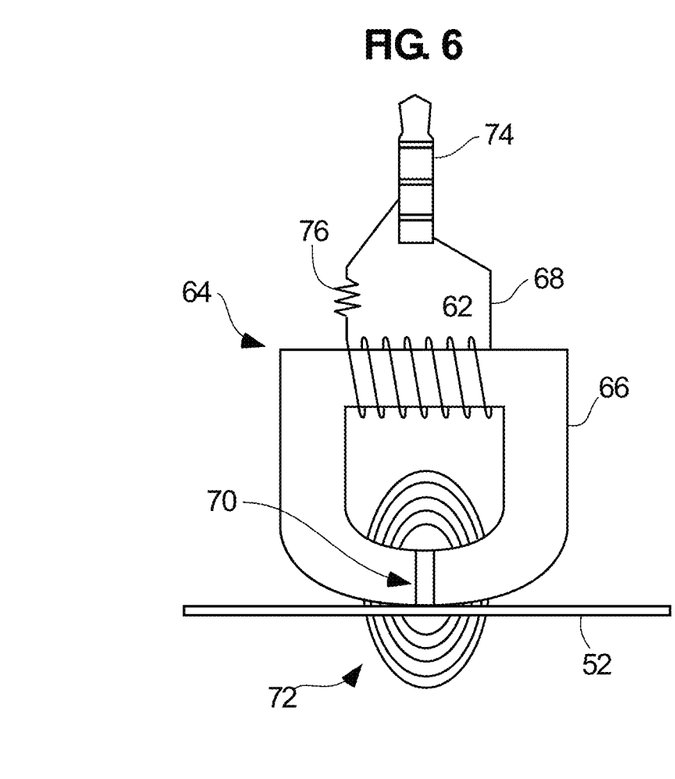
FIG. 6 is a schematic view of certain components of the card reader of FIG. 5.

An example mobile reader 60 according to one embodiment of the invention is illustrated, during operation with the MSC 40, in FIG. 5. In particular, the mobile reader 60 includes a portable body 62 that encloses a magnetic head assembly 64 (see FIG. 6). As detailed below, the portable body 62 can be used in combination with a mobile device in order to extract lightning strike data from the MSC 40 or other relevant MSC.

Various types of magnetic head assemblies can be used to read magnetic data from an MSC. In the illustrated embodiment, as shown in particular in FIG. 6, the magnetic head assembly 64 includes a magnetically permeable toroidal core 66 that is wound with a coil of conductive wire 68. A gap 70 is provided in the core 66, and can be configured an air gap or can be filled with a diamagnetic material, such as gold. With the assembly 64 thus arranged, as a magnetized material, such as the data-storage stripe 52, is moved past the gap 70 a resultant temporally changing magnetic field 72 induces a magnetic flux in the core 66. This flux, in turn, induces a current to flow in the wire 68, which can be conducted by the wire 68 to an audio plug 74 that is also attached to the portable body 62 (see also FIG. 5) in order to generate an electrical waveform signal at the audio plug 74. In the embodiment illustrated, the magnetic head assembly 64 further includes a resistor 76, as may be required by some mobile-device architectures.

As also discussed above, embodiments of the invention can be configured for use with a variety of mobile devices, such as tablets, smartphones, laptop computers, and so on. This may, for example, usefully allow users to utilize a variety of devices, including personal mobility devices, to assist in lightning monitoring, including at locations that may not readily provide a plug-in or other power supply. Further, for some devices, inherent connectivity (e.g., cellular capability) can allow for lightning strike data to be readily and immediately transmitted to other locations, such as for remote storage, remote monitoring, cloud-based or other analysis, and so on.

Figure 7:
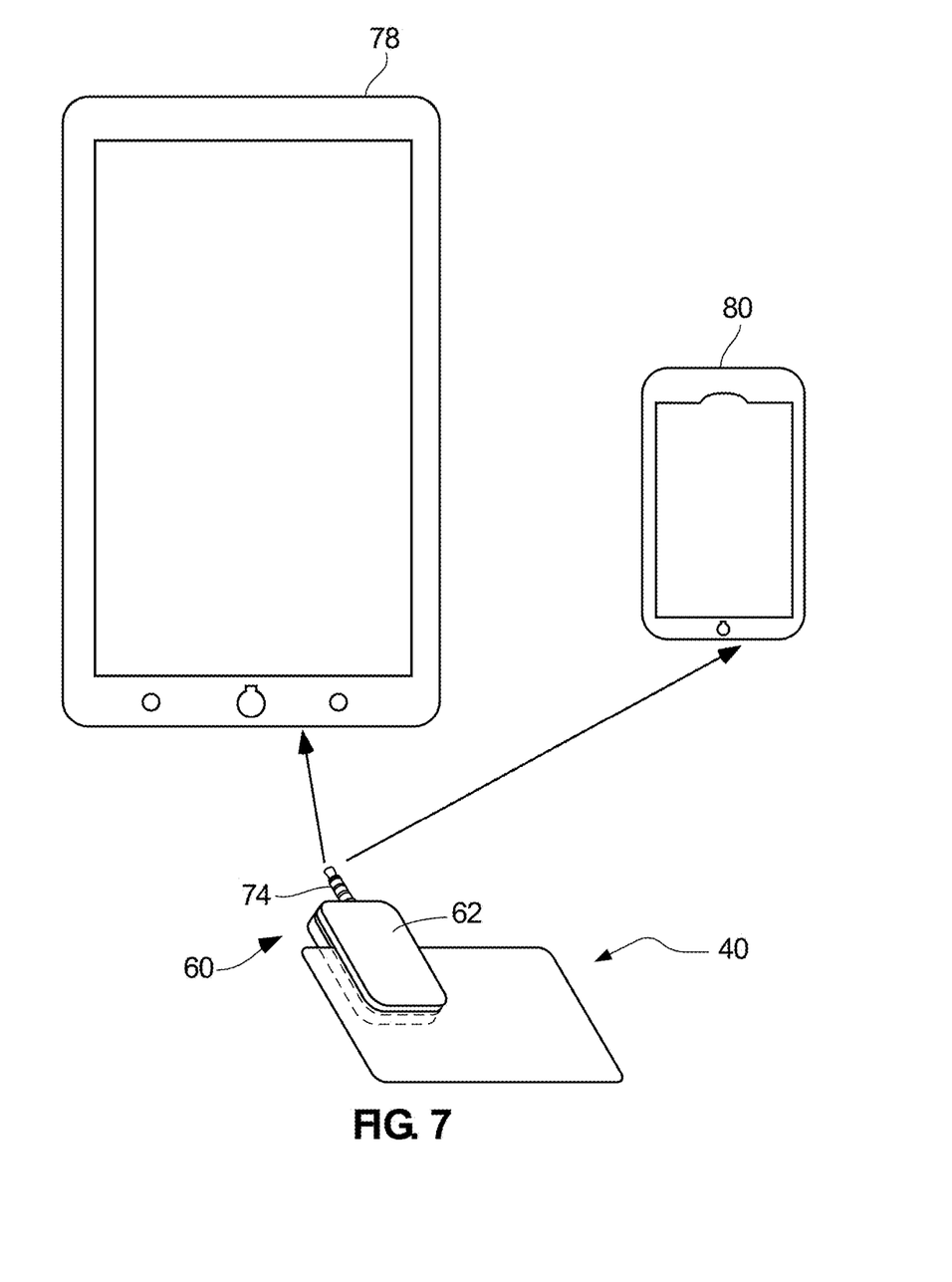
FIG. 7 is a schematic view of a method of using of the card reader of FIG. 5 with example mobile devices, according to embodiments of the invention.

In this regard, for example, as illustrated in FIG. 7, a user can insert the audio plug 74 into a headphone jack or other audio port of a mobile device, such as a tablet 78 or a smartphone 80. Accordingly, as the MSC 40 is slid past the by the magnetic head assembly 64, voltage changes in the audio plug 74 corresponding to the noted waveform can be received as an "audio" signal at the tablet 78 or the smartphone 80. Usefully, although such a signal may have a relatively small magnitude, such as on the order of microVolts (μV), appropriate audio ports for mobile devices can generally include or be connected to appropriate modules, such as operational amplifiers or other amplifying circuitry, that may allow the signal to be received and usefully processed.

Once received in the relevant mobile device, a signal from reader 60 that represents data from the MSC 40, can be processed, including in order to identify whether a lightning strike has been recorded, and the magnitude thereof. Generally, for example, software or hardware modules within the mobile device, or within a computing system that is in wireless (or other) communication with the mobile device, can be configured to decode, sample, and otherwise process the received waveform in order to identify a relevant indicator of the magnitude of any lightning strike. For an instance of the MSC 40, for example, that was encoded with a regularly repeating magnetic array of the maximum possible number of alternating magnetic poles (see also FIG. 4), relevant software or hardware modules can be configured to execute computer-implemented methods to identify and count a total number of peaks or troughs (or both) in the waveform received from the mobile reader 60. In other embodiments, other processing can be employed.

For the MSC 40 or another similar MSC, once a total number of peaks or troughs have been identified, this total can be compared with an expected total number of peaks or troughs in order to determine what portion of the data-storage stripe 52 has been erased. For example, software modules within a mobile app on the smartphone 80 or the tablet 78 can be configured to determine, based on an identified total of peaks or troughs in a signal and an expected (e.g., maximum possible) number of peaks or troughs, a length of a particular track of the data-storage stripe 52 (see, e.g., FIG. 3) that has been erased.

Figure 8A:
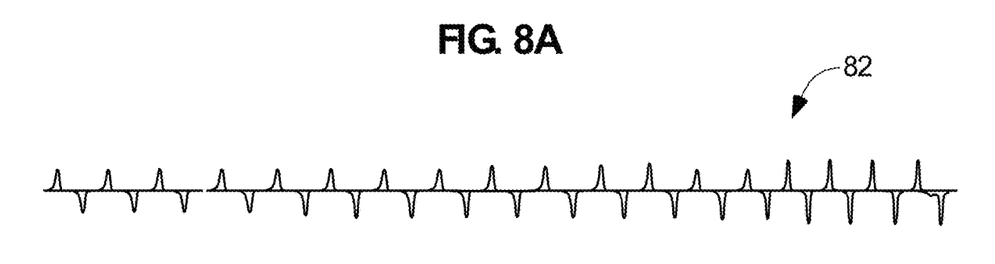
FIG. 8A is a schematic view of an output from the reader of FIG. 5 upon reading the magnetic stripe card of FIGS. 2 through 4 before a lightning strike.
Figure 8B:
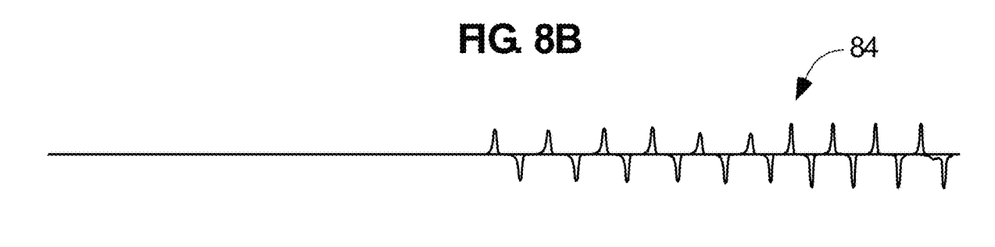
FIG. 8B is a schematic view of an output from the reader of FIG. 5 upon reading the magnetic stripe card of FIGS. 2 through 4 after one or more lightning strikes.

As noted above, the identified erased portion of the MSC 40 can then be directly correlated to the magnitude of current that was generated in the conductor 44 (see, e.g., FIG. 3) by the most severe lightning strike at the wind turbine 42. For example, based on the example waveform 82 illustrated in FIG. 8A, relevant software may identify that an entire signal from the MSC 40 includes regular peaks and troughs, which may indicate no portion of the data-storage stripe 52 has been erased. The software may accordingly determine that the MSC 40 was not exposed to significant magnetic flux when installed in the relevant lightning protection system and, correspondingly, that the wind turbine 42 was not subject to a lightning strike at all. In contrast, based on the example waveform 84 illustrated in FIG. 8B, relevant software may identify that the total number of peaks and troughs in the waveform correspond to approximately half of the expected number of peaks and troughs (e.g., as represented in the waveform 82 of FIG. 8A). This may in turn be determined to indicate that approximately half of the data-storage stripe 52 has been erased, and a magnitude of a lightning strike can be determined accordingly.

In different implementations, modules for a relevant mobile device (or remote system) can be configured to provide different degrees of accuracy in identifying and counting a total number of peaks or troughs in a received waveform. An example implementation is illustrated in the graph in FIG. 9, which presents data points relative to a vertical axis that indicates a total number of identified magnetic poles (e.g., as represented by a total number of waveform peaks or valleys) and relative to a horizontal axis that indicates a total distance on a data-storage stripe that has been erased. As illustrated by a trend-line 90, a generally linear correlation can be established between identified magnetic poles and the distance of data that was erased from a relevant MSC. Further, as also noted above, the distance of erased data can be readily correlated to the magnitude of the strongest lightning strike to which the MSC was exposed (see also FIGS. 2 through 4).

Figure 9:
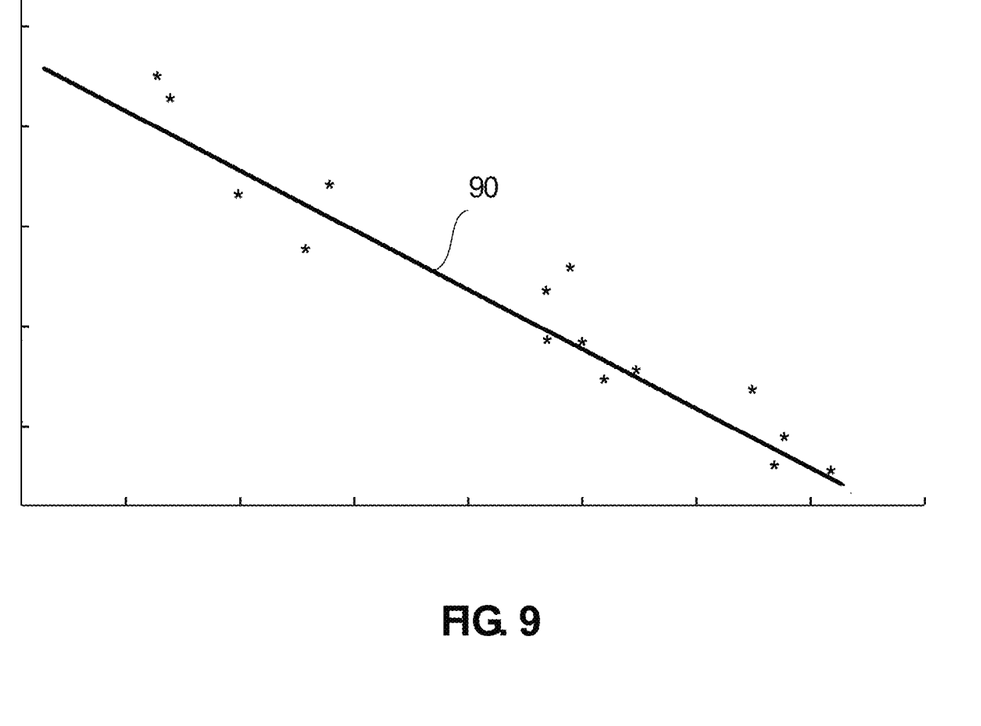
FIG. 9 is a schematic view of example results from analysis of a magnetic stripe card, relative to physical effects of a lightning strike on the magnetic stripe card, according to an embodiment of the invention.

In some implementations, as indicated by the somewhat scattered data points in FIG. 9, software modules of a mobile device for identifying and counting waveform contours can be configured to exhibit less than absolute accuracy (i.e., relatively substantial uncertainty) with regard to the actual number of waveform peaks or valleys in a given signal. Usefully, this can allow for faster operation of the software and of the relevant system in general once a waveform from a scanned MSC has been received. Further, through the use of the expected trend-line 90, the disclosed system can obtain a relatively reliable measure of the actual distance of erased data (and thereby the magnitude of a lightning strike), even with imperfect accuracy in identifying and counting the relevant number of poles.

Figure 10:
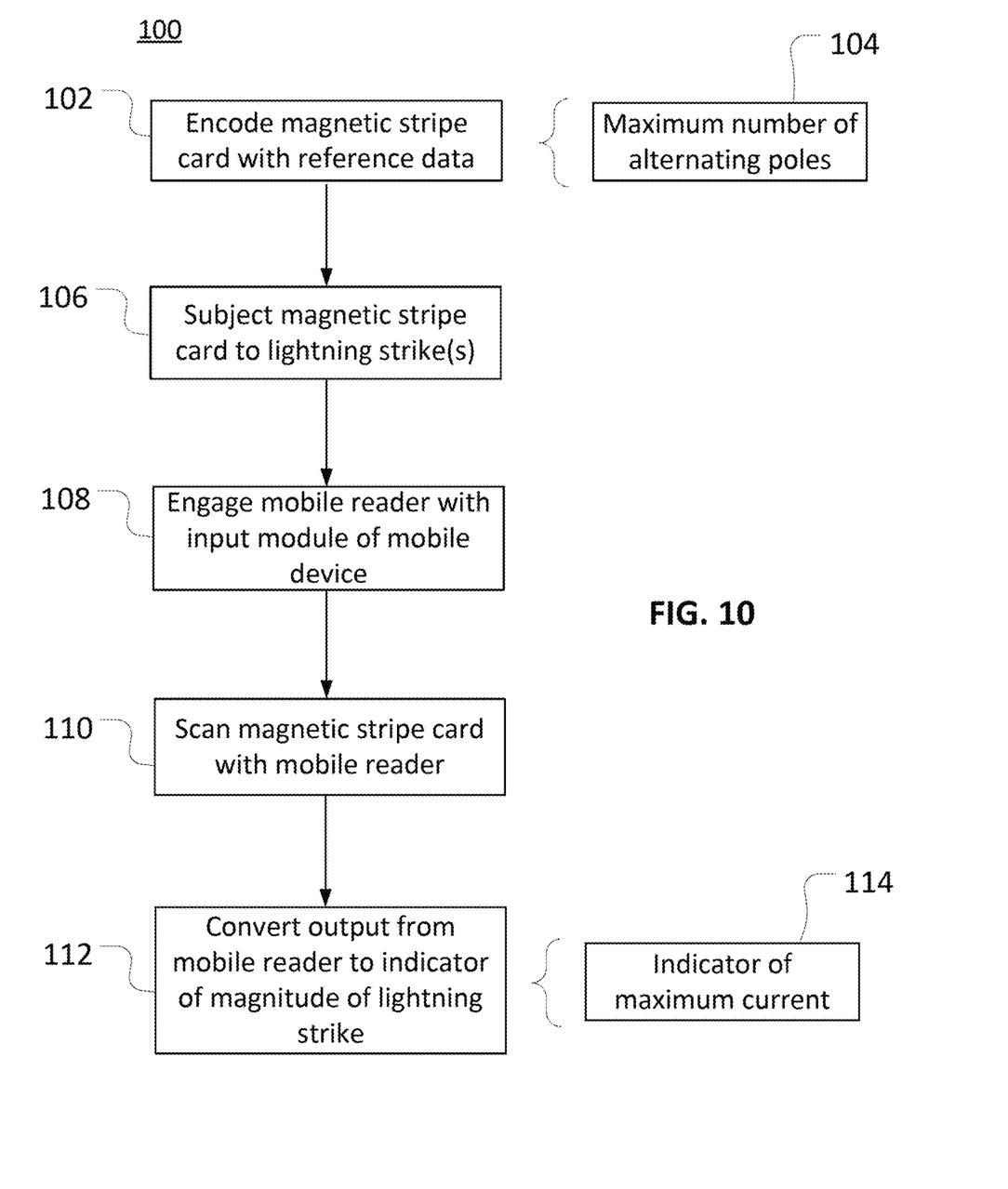
FIGS. 10 and 11 are schematic views of aspects of a method for identifying lightning strikes according to an embodiment of the invention.
Figure 11:
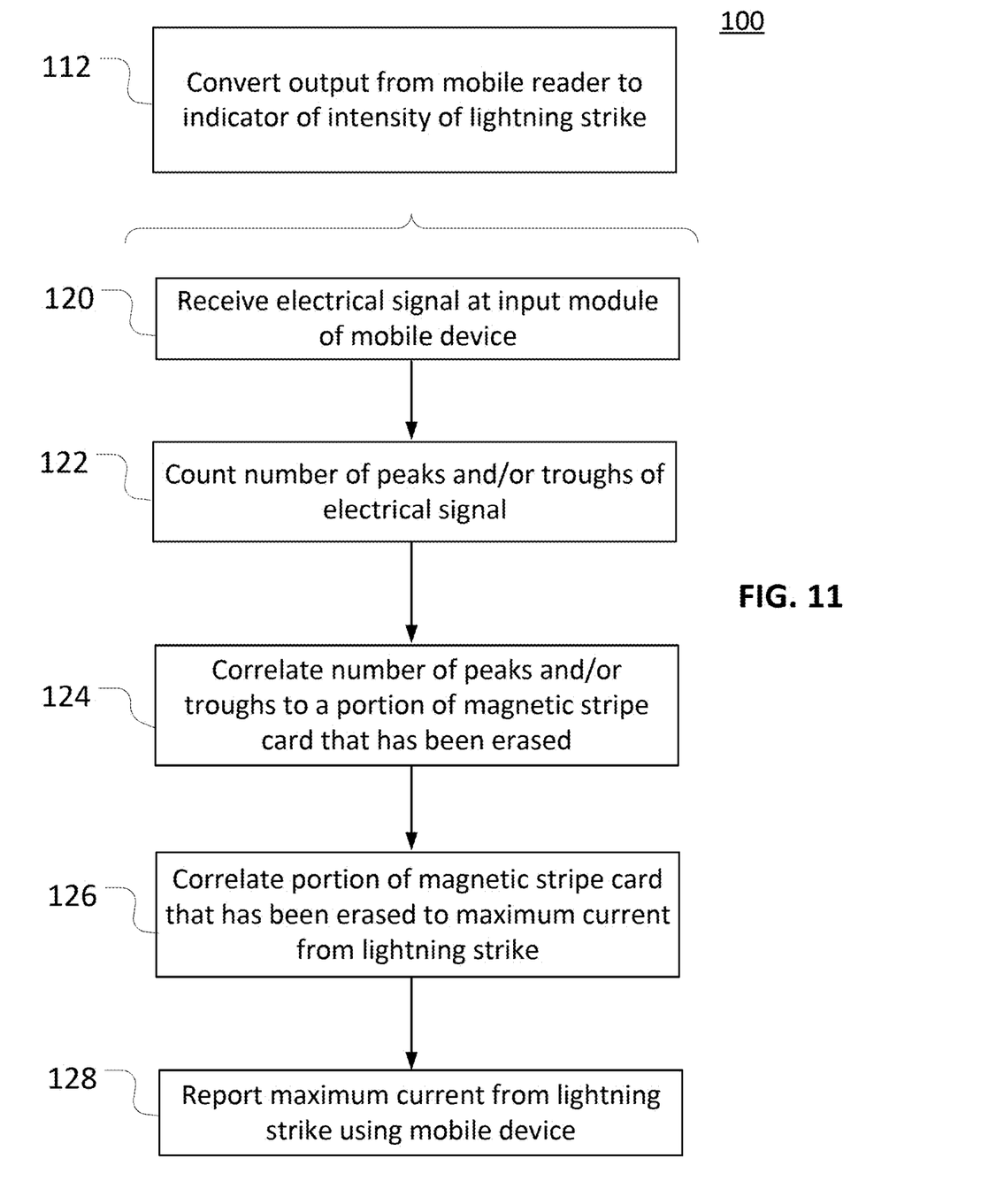

In some implementations, aspects of the invention can be implemented through a method, certain operations of which can be executed by one or more computing devices, including via software or hardware modules or combinations thereof implemented, in whole or in part, on mobile devices such as the tablet 78 or the smartphone 80 illustrated in FIG. 7. As illustrated in FIG. 10, for example, a method 100 can include encoding 102 an MSC with reference data, such as by configuring a data-storage stripe of the MSC with a maximum number of alternating magnetic poles 104 (see also, e.g., FIG. 4). The MSC can then be subjected 106 to one or more lightning strikes, such as through the use of the system illustrated in FIGS. 2 and 3. If the MSC has been subjected 106 to a lightning strike, or even if a lightning strike is merely suspected, a mobile reader, such as the mobile reader 60 illustrated in FIGS. 5 through 7, can be engaged 108 with an input module (e.g., an audio port) of a mobile device. For example, an wired output module of the mobile reader, such as an audio plug, can be engaged with mechanical (or other) connection to a relevant mechanical port of the mobile device, or a wireless output module can be engaged by establishing a communications link between the output module and the relevant input module.

The MSC can then be scanned 110 using a mobile reader and an output from the scanning 110 can be converted 112 to an indicator of a magnitude of the lightning strikes. In some embodiments, as also discussed above, the resulting indicator can be an indicator 114 (e.g., a value in kilo-Amperes) of a maximum current to which the MSC was exposed due to a strongest of one or more lightning strikes on a relevant structure.

As also discussed above, in some implementations, converting 112 the output from the scanning 110 of a MSC with a mobile reader can be implemented in various ways, via processing of signals received via an audio input port of a mobile device. As illustrated in FIG. 12, for example, a mobile device can be configured to receive 120 an electrical signal (e.g., a voltage waveform) at an input module (e.g., an audio input port) of the mobile device. Software or hardware modules associated with (e.g., installed on) the mobile device can then process the received 120 signal in order to identify and count 122 a number of peaks or troughs (or both) of the signal. The same or different modules can then correlate 124 the counted 122 number of peaks or troughs to a portion (e.g., a length) of a data-storage stripe that has been erased, and can correlate 126 that portion to a maximum current to which the MSC has been exposed. Finally, the same or different modules can report 128 the maximum current or another indicator for the measured lightning strike(s), including by using a display of the mobile device (e.g., a display of the smartphone 80 or the tablet 78 of FIG. 7) or by using communication devices of the mobile device to transmit relevant data to another location.

Thus, embodiments of the invention can provide an improved system or method for identifying and measuring lightning strikes on structures, particularly wind turbines. For example, through the provision and use of a portable reader that can operate with a variety of conventional mobile devices, embodiments of the invention can allow users to quickly and economically obtain data regarding lightning strikes, even at relatively remote locations that may not have ready access to power. Further, because embodiments of the invention can be used with cellular-enabled devices, users may be able to rapidly (e.g., immediately) transmit and analyze the data obtained, including in combination with data from multiple installations that may be located at substantial distances from each other.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A mobile reader system for a lightning protection system that includes a magnetic stripe card configured to retain data on a data-storage stripe and to have a portion of the data erased from the data-storage stripe in response to one or more lightning strikes on a structure, the mobile reader system comprising:
    a mobile reader body that supports a magnetic reader assembly and an output module, the magnetic reader assembly being configured to read the data-storage stripe to output a lightning-indicator signal to the output module; and
    one or more computer-implemented modules configured to:
        receive the lightning-indicator signal via an input module in communication with the output module; and
        identify, based on analysis of the lightning-indicator signal, an indicator of a maximum current passing through a portion of the structure from the one or more lightning strikes.

2. The mobile reader system of claim 1, wherein the input module is included in one of a smartphone or a tablet computer that is configured to implement at least one of the one or more computer-implemented modules.

3. The mobile reader system of claim 1, wherein the lightning-indicator signal is a waveform signal; and
    wherein identifying the indicator of the maximum current includes counting at least one of a number of peaks or a number of troughs in the waveform signal.

4. The mobile reader system of claim 3, wherein identifying the indicator of the maximum current further includes correlating the counted at least one of the number of peaks or the number of troughs with a length of the portion of the data-storage stripe that has been erased in response to the one or more lightning strikes.

5. The mobile reader system of claim 4, wherein identifying the indicator of the maximum current further includes correlating the length of the portion of the data-storage stripe that has been erased in response to the one or more lightning strikes with the maximum current.

6. The mobile reader system of claim 1, wherein the output module is an s plug and the input module is an audio port of a mobile device.

7. The mobile reader system of claim 1, further comprising:
    the magnetic stripe card, wherein the data retained on the data-storage stripe prior to the one or more lightning strikes includes a maximum number of alternating magnetic poles that can be maintained on the data-storage stripe.

8. A lightning protection system for a structure that is exposed to one or more lightning strikes, the lightning protection system including:
    a magnetic stripe card configured to retain data on a data-storage stripe and to have a portion of the data erased in response to the one or more lightning strikes;
    a mobile reader body supporting a magnetic reader assembly that includes an output module, the magnetic reader assembly being configured to read the data-storage stripe to output a lightning-indicator signal via the output module; and
    one or more computer-implemented modules configured to:
        receive the lightning-indicator signal via an input module of a handheld computing device that is in communication with the output module; and
        identify, based on analysis of the lightning-indicator signal, an indicator of a maximum current passing through the structure from the one or more lightning strikes.

9. The lightning protection system of claim 8, wherein the lightning-indicator signal is a waveform signal; and
    wherein identifying the indicator of the maximum current includes correlating a number of peaks or troughs in the waveform signal with a length of the data-storage stripe that has been erased in response to the one or more lightning strikes.

10. The lightning protection system of claim 9, wherein identifying the indicator of the maximum current further includes correlating the length of the data-storage stripe that has been erased with the maximum current.

11. The lightning protection system of claim 8, wherein the output module is an audio plug and the input module is an audio port of a mobile device, the audio port being configured to mechanically receive the audio plug to support mobile reader body relative to the mobile device.

12. The lightning protection system of claim 8, wherein the one or more computer-implemented modules are further configured to report the indicator of the maximum current on a display of the handheld computing device that includes the input module.

13. The lightning protection system of claim 8, wherein the data retained on the data-storage stripe prior to the one or more lightning strikes includes a maximum number of alternating magnetic poles that can be maintained on the data-storage stripe.

14. The lightning protection system of claim 13, wherein the data-storage stripe is rated as at least a 4000 oersted stripe.

15. A method of monitoring a structure that is exposed to one or more lightning strikes, the method comprising:
    retrieving from the structure a magnetic stripe card, the magnetic stripe card being configured to retain data on a data-storage stripe and having had a portion of the data erased in response to the one or more lightning strikes on the structure;

scanning the data-storage stripe with a mobile reader system to provide a lightning-indicator signal at an output module of the mobile reader system;

receiving the lightning-indicator signal, via the output module, at an input module of a mobile computing device; and identifying, based on computer-implemented analysis of the received lightning-indicator signal, an indicator of a maximum current passing through a portion of the structure from the one or more lightning strikes.

16. The method of claim 15, wherein the mobile computing device is one of a smartphone or a tablet computer; and wherein at least part of the identifying of the indicator of the maximum current is executed by the one of the smartphone or the tablet computer.

17. The method of claim 15, wherein the lightning-indicator signal is a waveform signal; and wherein identifying the indicator of the maximum current includes counting at least one of a number of peaks or a number of troughs in the waveform signal.

18. The method of claim 17, wherein identifying the indicator of the maximum current further includes correlating the counted at least one of the number of peaks or the number of troughs with a size of the portion of the data-storage stripe that has been erased in response to the one or more lightning strikes.

19. The method of claim 18, wherein identifying the indicator of the maximum current further includes correlating the size of the portion of the data-storage stripe that has been erased in response to the one or more lightning strikes with the maximum current.

20. The method of claim 15, wherein the output module is an audio plug of the mobile reader system and the input module is an audio input port of the mobile computing device.

* * * * *